（12）United States Patent
Lim et al.

(10) Patent No.: US 10,810,144 B2
(45) Date of Patent: Oct. 20, 2020

(54) SYSTEM AND METHOD FOR OPERATING A DRR-COMPATIBLE ASYNCHRONOUS MEMORY MODULE

(71) Applicant: Samsung Electronics Co., Ltd., Suwon-si, Gyeonggi-do (KR)

(72) Inventors: Sun Young Lim, Hwasung (KR); Mu-Tien Chang, Santa Clara, CA (US); Dimin Niu, Sunnyvale, CA (US); Hongzhong Zheng, Los Gatos, CA (US); Indong Kim, Hwasung (KR)

(73) Assignee: Samsung Electronics Co., Ltd. (KR)

( * ) Notice: Subject to any disclaimer, the term of this patent is extended or adjusted under 35 U.S.C. 154(b) by 308 days.

(21) Appl. No.: 15/285,423

(22) Filed: Oct. 4, 2016

(65) Prior Publication Data

US 2017/0357604 A1  Dec. 14, 2017

Related U.S. Application Data

(60) Provisional application No. 62/347,569, filed on Jun. 8, 2016, provisional application No. 62/368,806, filed on Jul. 29, 2016, provisional application No. 62/371,588, filed on Aug. 5, 2016.

(51) Int. Cl.
*G06F 13/16* (2006.01)
*G06F 3/06* (2006.01)
*G06F 12/0868* (2016.01)

(52) U.S. Cl.
CPC ........ *G06F 13/1673* (2013.01); *G06F 3/0607* (2013.01); *G06F 3/0659* (2013.01); *G06F 3/0685* (2013.01); *G06F 12/0868* (2013.01); *G06F 2212/7203* (2013.01); *G11C 2207/2245* (2013.01)

(58) Field of Classification Search
None
See application file for complete search history.

(56) References Cited

U.S. PATENT DOCUMENTS

| | | | |
|---|---|---|---|
| 5,907,867 A * | 5/1999 | Shinbo | G06F 12/1027 711/207 |
| 6,643,756 B1 * | 11/2003 | Aleksic | G06F 3/14 345/533 |
| 7,941,591 B2 | 5/2011 | Aviles | |
| 8,281,074 B2 | 10/2012 | Jeddeloh | |
| 8,560,761 B2 | 10/2013 | Tzeng | |

(Continued)

FOREIGN PATENT DOCUMENTS

| JP | 2001-10865 A | 1/2001 |
|---|---|---|
| JP | 2001-14842 A | 1/2001 |

*Primary Examiner* — Reginald G Bragdon
*Assistant Examiner* — Curtis James Kortman
(74) *Attorney, Agent, or Firm* — Innovation Counsel LLP (57) ABSTRACT

A method includes: providing a DDR interface between a host memory controller and a memory module; and providing a message interface between the host memory controller and the memory module. The memory module includes a non-volatile memory and a DRAM configured as a DRAM cache of the non-volatile memory. Data stored in the non-volatile memory of the memory module is asynchronously accessible by a non-volatile memory controller of the memory module, and data stored in the DRAM cache is directly and synchronously accessible by the host memory controller.

20 Claims, 9 Drawing Sheets (56) References Cited

U.S. PATENT DOCUMENTS

| | | |
|---|---|---|
| 8,713,379 B2 | 4/2014 | Takefman et al. |
| 8,738,840 B2 | 5/2014 | Tzeng |
| 9,251,003 B1 | 2/2016 | Gupta et al. |
| 9,460,791 B1* | 10/2016 | Shallal .................. G11C 7/08 |
| 2005/0188137 A1* | 8/2005 | Fujiki ................ G06F 13/4217 |
| | | 710/110 |
| 2007/0162720 A1* | 7/2007 | Branda ................ G06F 9/5077 |
| | | 711/173 |
| 2009/0037666 A1* | 2/2009 | Rahman .............. G06F 12/0846 |
| | | 711/143 |
| 2010/0110748 A1* | 5/2010 | Best .................... G06F 12/0638 |
| | | 365/51 |
| 2014/0192583 A1* | 7/2014 | Rajan ....................... G11C 7/10 |
| | | 365/63 |
| 2015/0186278 A1 | 7/2015 | Jaykumar et al. |
| 2016/0118121 A1 | 4/2016 | Kelly |
| 2016/0179375 A1 | 6/2016 | Kirvan et al. |
| 2017/0092339 A1* | 3/2017 | Park ....................... G11C 16/10 |
| 2017/0322726 A1* | 11/2017 | Walker ................ G06F 13/1626 |

* cited by examiner

SYSTEM AND METHOD FOR OPERATING A DRR-COMPATIBLE ASYNCHRONOUS MEMORY MODULE

CROSS-REFERENCE TO RELATED APPLICATION(S)

This application claims the benefits of and priority to U.S. Provisional Patent Application Ser. Nos. 62/347,569 filed Jun. 8, 2016, 62/368,806 filed on Jul. 29, 2016, and 62/371,588 filed on Aug. 5, 2016 the disclosures of which are incorporated herein by reference in their entirety.

TECHNICAL FIELD

The present disclosure relates generally to memory systems, more particularly, to a system and method for operating a double data rate (DDR)-compatible asynchronous memory module.

BACKGROUND

A non-volatile dual in-line memory module (NVDIMM) can contain various media types or a mix of media types including non-volatile memories (e.g., NAND flash memory) and traditional dynamic random-access memories (DRAMs). The NVDIMM can plug into a DIMM socket and appear to be a standard DDR4 synchronous DRAM (SDRAM) memory module to a host memory controller. The NVDIMM interface is a DDR4-extended memory interface that allows the host computer and the memory module to communicate asynchronously over a DDR4 memory channel. An NVDIMM may share the DDR4 memory channel with another standard DDR4 DIMM.

The NVDIMM interface is optimized for memory-mapped NVDIMMs including one or more high-capacity non-volatile memories. The NVDIMM can be a memory channel device with a non-volatile capacity that functions as an addressable memory rather than as a storage device. Current works are emphasized on providing the backward compatibility of NVDIMMs on existing DDR4-based memory systems.

SUMMARY

According to one embodiment, a method includes: providing a DDR interface between a host memory controller and a memory module, the memory module comprising a non-volatile memory and a DRAM configured as a DRAM cache of the non-volatile memory; and providing a message interface between the host memory controller and the memory module. Both the non-volatile memory and the DRAM of the memory module are coupled to a data buffer and a registering clock driver (RCD) that includes a control and address (CA) buffer. The data buffer is configured to provide data requested by the host memory controller or a status of the memory module via a data (DQ) bus of the DDR interface and the message interface. The RCD is configured to generate command sequences to the data buffer based on commands and addresses received via a CA bus of the DDR interface. Data stored in the non-volatile memory of the memory module is asynchronously accessible by a non-volatile memory controller of the memory module. Data stored in the DRAM cache is directly and synchronously accessible by the host memory controller.

According to another embodiment, a memory module includes: a non-volatile memory; a non-volatile memory controller configured to provide a data interface and a control and address (CA) interface to the non-volatile memory; a DRAM configured as a DRAM cache of the non-volatile memory; a data buffer; a registering clock driver (RCD) including a control and address (CA) buffer; and a DDR interface and a message interface to a host memory controller. Both the non-volatile memory and the DRAM are coupled to the data buffer and the registering clock driver (RCD). The data buffer is configured to provide data requested by the host memory controller or a status of the memory module via a data (DQ) bus of the DDR interface and the message interface. The RCD is configured to generate command sequences to the data buffer based on commands and addresses received via a CA bus of the DDR interface. Data stored in the non-volatile memory of the memory module is asynchronously accessible by the non-volatile memory controller. Data stored in the DRAM cache is directly and synchronously accessible by the host memory controller.

According to yet another embodiment, a memory system includes: a host memory controller; a memory module; a DDR interface established between the host memory controller and the memory module, wherein the DDR interface comprises a data bus and a control and address (CA) bus; and a message interface established between the host memory controller and the memory module. The memory module includes: a non-volatile memory; a non-volatile memory controller configured to provide a data interface and a control and address (CA) interface to the non-volatile memory; a DRAM configured as a DRAM cache of the non-volatile memory; a data buffer; and a registering clock driver (RCD) including a control and address (CA) buffer. Both the non-volatile memory and the DRAM are coupled to the data buffer and the registering clock driver (RCD). The data buffer is configured to provide data requested by the host memory controller or a status of the memory module via a data (DQ) bus of the DDR interface and the message interface. The RCD is configured to generate command sequences to the data buffer based on commands and addresses received via a CA bus of the DDR interface. Data stored in the non-volatile memory of the memory module is asynchronously accessible by the non-volatile memory controller. Data stored in the DRAM cache is directly and synchronously accessible by the host memory controller.

The above and other preferred features, including various novel details of implementation and combination of events, will now be more particularly described with reference to the accompanying figures and pointed out in the claims. It will be understood that the particular systems and methods described herein are shown by way of illustration only and not as limitations. As will be understood by those skilled in the art, the principles and features described herein may be employed in various and numerous embodiments without departing from the scope of the present disclosure.

BRIEF DESCRIPTION OF THE DRAWINGS

The accompanying drawings, which are included as part of the present specification, illustrate the presently preferred embodiment and together with the general description given above and the detailed description of the preferred embodiment given below serve to explain and teach the principles described herein.

The figures are not necessarily drawn to scale and elements of similar structures or functions are generally represented by like reference numerals for illustrative purposes throughout the figures. The figures are only intended to facilitate the description of the various embodiments described herein. The figures do not describe every aspect of the teachings disclosed herein and do not limit the scope of the claims.

DETAILED DESCRIPTION

Each of the features and teachings disclosed herein can be utilized separately or in conjunction with other features and teachings to provide a system and method for operating a double data rate (DDR)-compatible asynchronous memory module. Representative examples utilizing many of these additional features and teachings, both separately and in combination, are described in further detail with reference to the attached figures. This detailed description is merely intended to teach a person of skill in the art further details for practicing aspects of the present teachings and is not intended to limit the scope of the claims. Therefore, combinations of features disclosed above in the detailed description may not be necessary to practice the teachings in the broadest sense, and are instead taught merely to describe particularly representative examples of the present teachings.

In the description below, for purposes of explanation only, specific nomenclature is set forth to provide a thorough understanding of the present disclosure. However, it will be apparent to one skilled in the art that these specific details are not required to practice the teachings of the present disclosure.

Some portions of the detailed descriptions herein are presented in terms of algorithms and symbolic representations of operations on data bits within a computer memory. These algorithmic descriptions and representations are used by those skilled in the data processing arts to effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the below discussion, it is appreciated that throughout the description, discussions utilizing terms such as "processing," "computing," "calculating," "determining," "displaying," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The algorithms presented herein are not inherently related to any particular computer or other apparatus. Various general-purpose systems, computer servers, or personal computers may be used with programs in accordance with the teachings herein, or it may prove convenient to construct a more specialized apparatus to perform the required method steps. The required structure for a variety of these systems will appear from the description below. It will be appreciated that a variety of programming languages may be used to implement the teachings of the disclosure as described herein.

Moreover, the various features of the representative examples and the dependent claims may be combined in ways that are not specifically and explicitly enumerated in order to provide additional useful embodiments of the present teachings. It is also expressly noted that all value ranges or indications of groups of entities disclose every possible intermediate value or intermediate entity for the purpose of an original disclosure, as well as for the purpose of restricting the claimed subject matter. It is also expressly noted that the dimensions and the shapes of the components shown in the figures are designed to help to understand how the present teachings are practiced, but not intended to limit the dimensions and the shapes shown in the examples.

According to one embodiment, a non-volatile dual in-line memory module (NVDIMM) can include one or more non-volatile memories (e.g., flash memory) as well as standard DRAMs. The NVDIMM can be configured operate in a variety of modes, for example but not limited to, a direct mode and a cache mode. The present disclosure provides support to operate an NVDIMM and improve the latency of the NVDIMM. In particular, the present disclosure provides detailed protocols to operate an NVDIMM in a cache mode including memory commands and control operations.

Figure 1A:
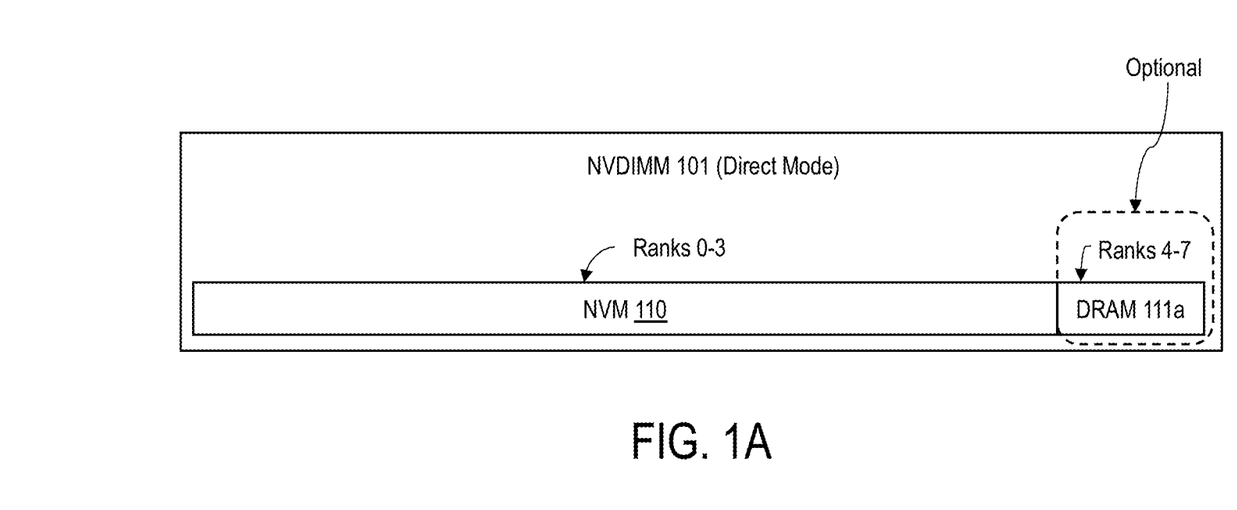
FIG. 1A shows an example NVDIMM configured to operate in a direct mode, according to one embodiment.

FIG. 1A shows an example NVDIMM configured to operate in a direct mode, according to one embodiment. When the NVDIMM 101 is configured to operate in the direct mode, a memory controller of a host computer can directly access both the DRAM 111a and the non-volatile memory 110 of the NVDIMM 101. In one embodiment, the DRAM 111a and the non-volatile memory 110 are addressable in different address spaces. For example, the non-volatile memory 110 can be addressed via rank addresses 0-3 while the DRAM 111a can be optionally addressed via rank addresses 4-7. The available memory space of the NVDIMM 101 may correspond to the sum of the memory capacities of the DRAM and the non-volatile memory.

Figure 1B:
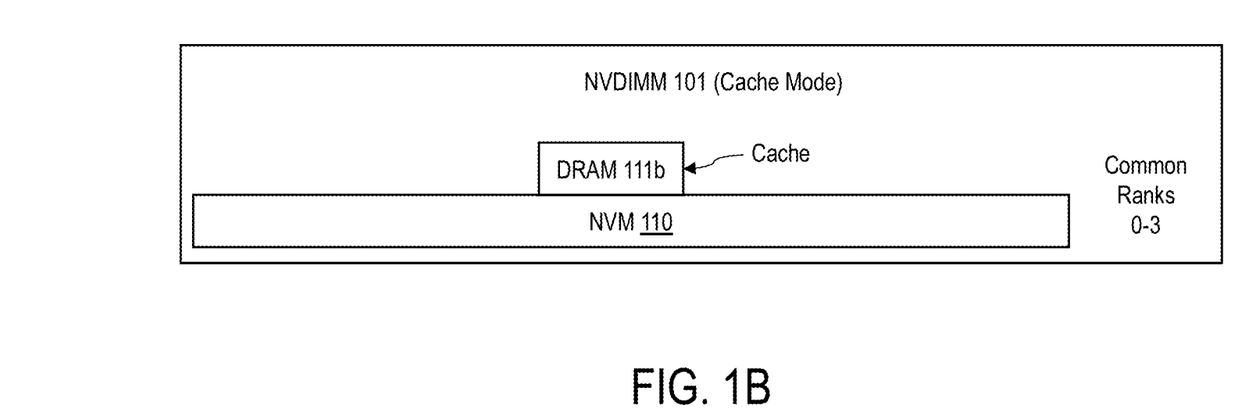
FIG. 1B shows an example NVDIMM configured to operate in a cache mode, according to one embodiment.

FIG. 1B shows an example NVDIMM configured to operate in a cache mode, according to one embodiment. In the cache mode, the non-volatile memory 110 of the NVDIMM 101 can be addressed via common rank addresses 0-3. However, the DRAM 111b of the NVDIMM 101 is not directly addressable, but can be configured to serve as a cache for the non-volatile memory 110 of the NVDIMM 101. Because the DRAM cache 111b is configured as a cache for non-volatile memory 110 of the NVDIMM 101, the DRAM cache 111b may be transparent to host memory controller.

In one embodiment, the serial presence detect (SPD) of the NVDIMM can contain information about the modes that the NVDIMM can support, and the memory controller can receive the information during system initialization. If the NVDIMM can support only one mode, the memory controller configures the NVDIMM in the mode that the NVDIMM supports. If the DIMM supports both of the direct and cache modes, the memory controller can configure the NVDIMM for a specific mode.

The mode of operation for the NVDIMM can be configured in a variety of ways. In one embodiment, the memory controller can send a mode register set (MRS) command to configure the mode register of the NVDIMM. In this case, the mode register contains a field that specifies the direct mode or the cache mode. In another embodiment, the memory controller can write to a specific memory address that corresponds to a special function register on the NVDIMM. In this case, the special function register contains a field that specifies the direct mode or the cache mode.

Figure 2A:
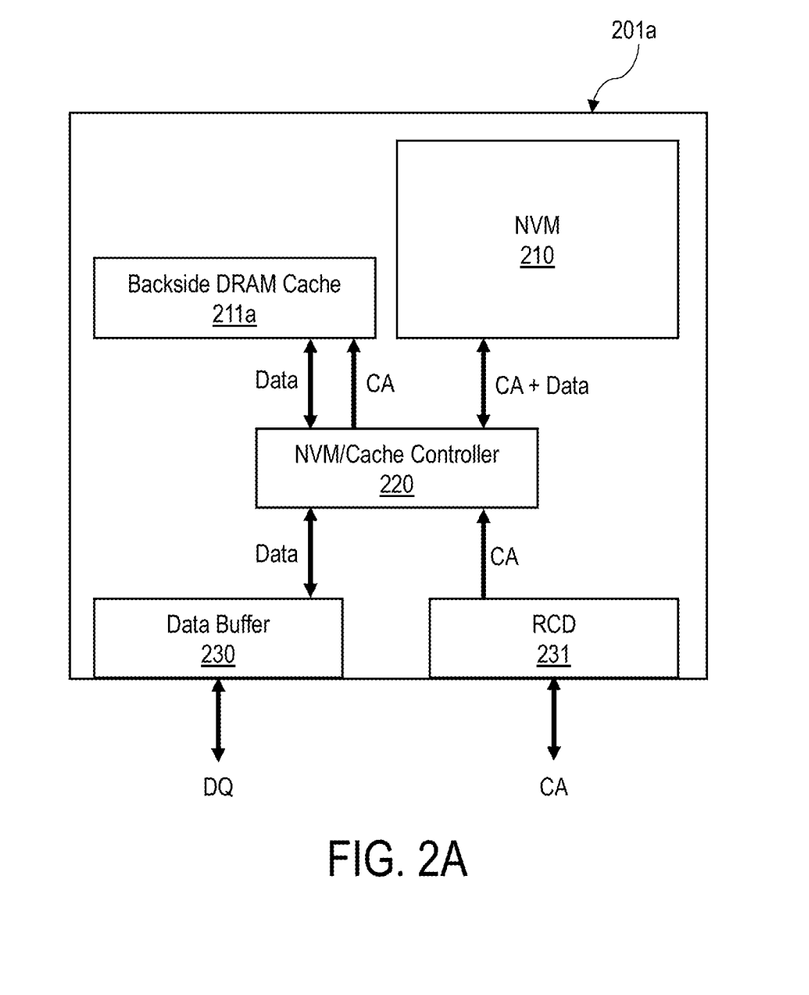
FIG. 2A shows an example of an NVDIMM including a backside DRAM cache, according to one embodiment.

According to some embodiments, the DRAM cache 111b of the present NVDIMM 101 can be implemented as a backside DRAM cache or a frontside DRAM cache. FIG. 2A shows an example of an NVDIMM including a backside DRAM cache, according to one embodiment. The NVDIMM 201a includes a non-volatile memory 210, a backside DRAM cache 211a, and a NVM/cache controller 220. A data buffer 230 of the NVDIMM 201a provides data that is requested by a host memory controller (not shown) of a status of the NVDIMM 201a via the data (DQ) bus. A registering clock driver (RCD) 231 of the NVDIMM 201a provides a control and address (CA) buffer that generates command sequences to the data buffer 230.

The backside DRAM cache 211a is coupled to the NVM/cache controller 220 and can receive data from the data buffer 230 and control and address from the RCD 231 via the NVM/cache controller 220. This prohibits a direct access to the backside DRAM cache 211a by the host memory controller. The host memory controller can access the backside DRAM cache 211a in the direct mode but cannot directly access the backside DRAM cache 211a in the cache mode. The access to the backside DRAM cache 211a would require handshaking, resulting in a longer access time than a conventional access time to a DRAM, for example, by more than 15 ns.

Figure 2B:
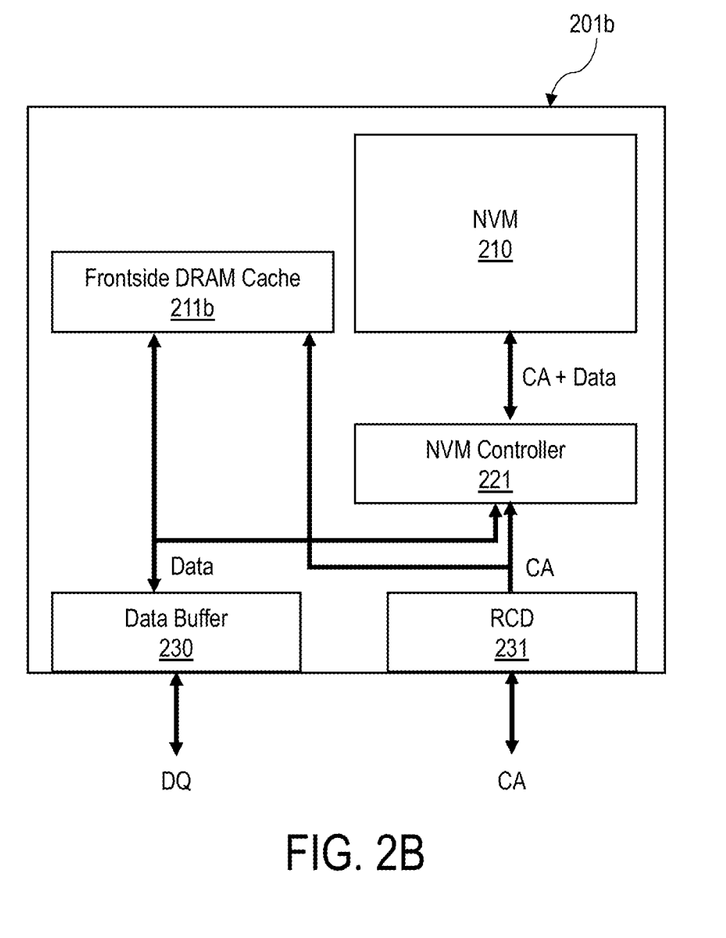
FIG. 2B shows an example of an NVDIMM including a frontside DRAM cache, according to one embodiment.

FIG. 2B shows an example of an NVDIMM including a frontside DRAM cache, according to one embodiment. The NVDIMM 201b includes a non-volatile memory 210, a frontside DRAM cache 211b, and a NVM controller 221. A data buffer 230 of the NVDIMM 201b buffers data that is communicated to and from a host memory controller (not shown) via the data (DQ) bus. A registering clock driver (RCD) 231 of the NVDIMM 201b is a control and address (CA) buffer that generates command sequences to the data buffer 230.

Compared to the backside DRAM cache 211a of the NVDIMM 201a shown in FIG. 2A, the frontside DRAM cache 211b of the NVDIMM 201b is directly accessible by a host memory controller. This mode of operation is referred to herein as a cache mode. The cache mode access to the frontside DRAM cache 211b requires no handshaking overhead, making the access to the frontside DRAM cache 211b as fast as an access to a conventional DRAM.

The present disclosure provides various commands for operating an NVDIMM, particularly in the cache mode. Examples of such commands for the NVDIMM in the cache mode include, but are not limited to, a fast cache-read command, an internal operation command, a flush command, a transaction burst command, and a read status command.

The fast cache-read command enables a low latency cache access to a DRAM cache. The internal operation command allows the NVDIMM to perform internal operations without conflicting with the host memory controller. The NVM/cache controller 220 can include a write buffer (e.g., SRAM). For an incoming write command, the write data is first stored in the write buffer of the NVM/cache controller 220, and the NVM/cache controller 220 writes the data from the write buffer to either the DRAM cache or the NVM 210. The flush command allows the host memory controller to instruct the NVDIMM to flush the write buffer of the NVM/cache controller 220 and/or the DRAM cache. The flush command ensures that the data that are stored in a volatile region (i.e., the write buffer) are written to a non-volatile region so that the data becomes persistent. Unless explicitly stated otherwise, a DRAM cache referred to herein may refer to the frontside DRAM cache shown in FIG. 2B. The DRAM cache and the frontside DRAM cache be interchangeably used herein without deviating from the scope of the present disclosure.

Figure 3A:
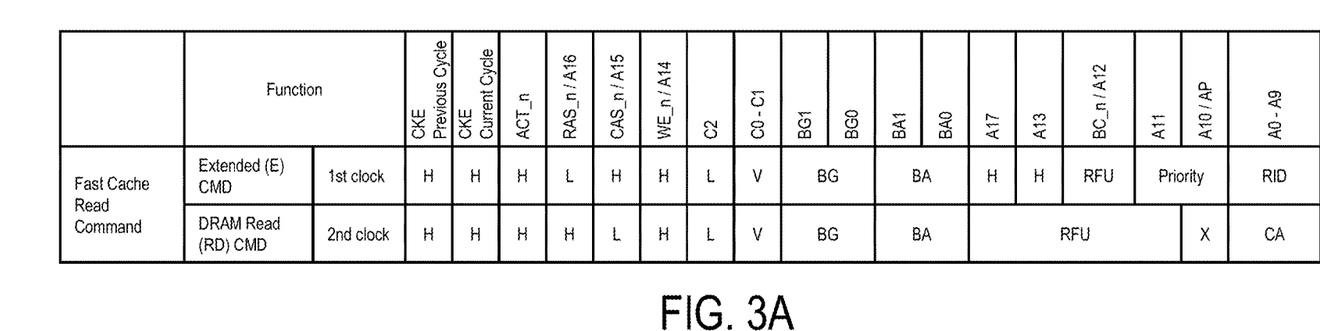
FIG. 3A is a table showing a definition of an example fast cache-read command, according to one embodiment.

According to one embodiment, a fast cache-read command allows a host memory controller to quickly access the DRAM cache without incurring a handshaking overhead. FIG. 3A is a table showing a definition of an example fast cache-read command, according to one embodiment. The fast cache-read command includes an extended (E) command issued in the first clock cycle followed by a DRAM read (RD) command issued in the second clock cycle.

Figure 3B:
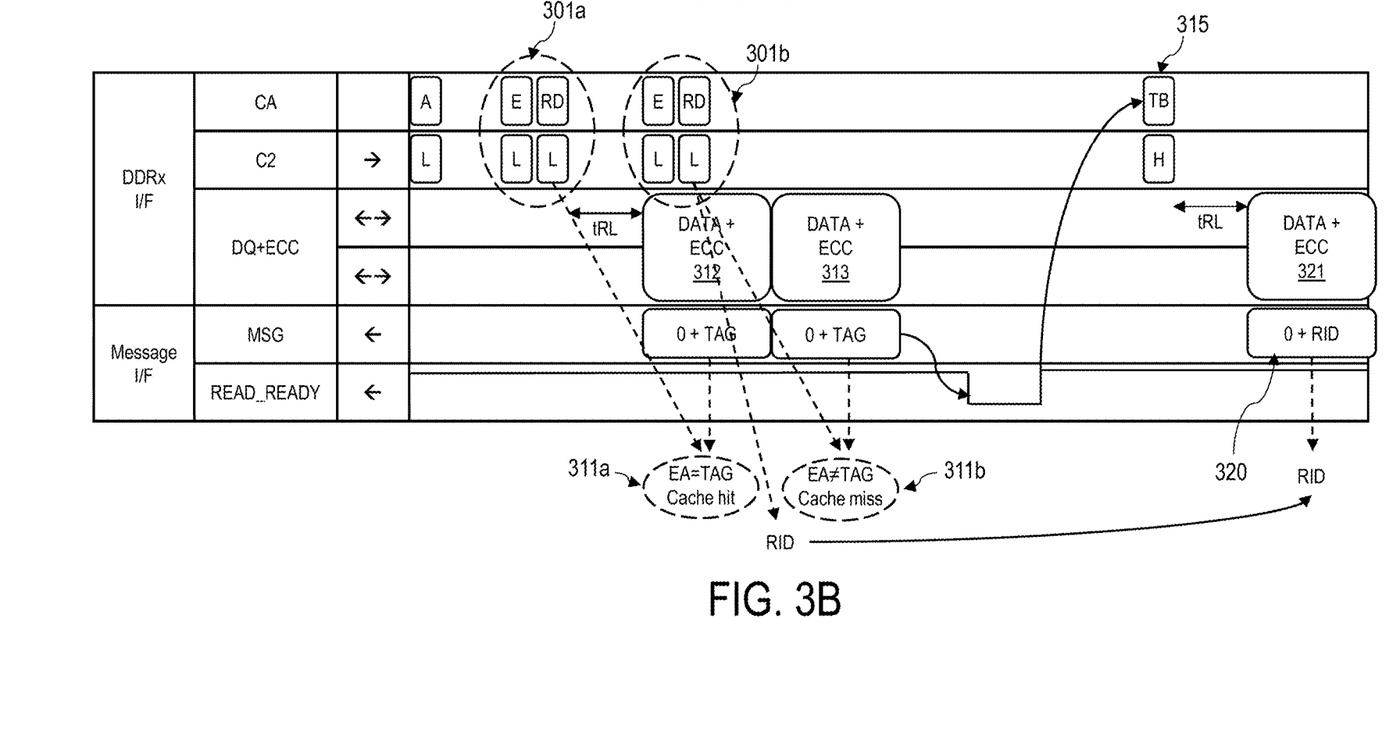
FIG. 3B shows a timing diagram of the example fast cache-read command, according to one embodiment.

FIG. 3B shows a timing diagram of the example fast cache-read command, according to one embodiment. With the combination of E+RD commands, the host memory controller can get data and a tag after a fixed DRAM latency with the same latency as or a similar latency to a standard DDR4 interface. After receiving the E+RD commands, a NVM controller (e.g., NVM controller 221 of FIG. 2B) can post a tag on the message (MSG) pins. According to one embodiment, the host memory controller can check the tag to identify if the data associated with the fast cache-read command and the data loaded on the data bus DQ is a cached data. The host memory controller or the NVM controller can have a cache management logic. According to one embodiment, the cache management logic can check a tag to determine cache hit or cache miss. When the host memory controller sends out a read request, the host memory controller keeps track of the address and the corresponding tag. When the read data returns, the host memory controller can use the returned tag to match the tag with an outstanding read request. For example, if the tag indicates that it is a cache hit, the host memory controller determines that the data loaded on the data bus DQ is valid, otherwise the host memory controller determines that it is a cache miss and determines that the data loaded on the data bus DQ is invalid. In case of cache miss, the host memory controller can ignore the data on the DQ bus.

After receiving the E+RD commands over the CA bus, the NVM controller internally checks the tag associated with the fast cache-read request. The tag may be stored in a separate block of the memory (e.g., DRAM) on the NVDIMM. The host memory controller can generate an extended address (EA), and the NVM controller can decode the EA and perform a tag match. If the extended address (EA) and the tag matches (e.g., 311a), the NVM controller determines that it is a cache hit and does nothing. In this case, the cache management logic can load the cached data 312 from the DRAM cache on the data buffer 230, and the data buffer 230 automatically puts the data on the data bus DQ. The host memory controller can synchronously retrieve the cached data from the data buffer 230. An error-correcting code (ECC) protection, such as cyclic redundancy check (CRC) or parity, may be used for packet integrity protection at the DQ bus. If the EA and the tag does not match (e.g., 311b), the NVM controller determines that it is a cache miss, and loads the requested data stored in the non-volatile memory to the data buffer 230.

According to one embodiment, the read ID (RID) included in the extended command (e.g., A0-A9) is used to identify the relationship between a read request and read data from the NVDIMM. The RID can be generated in various ways. In one embodiment, the host memory controller can explicitly generate the RID. In this case, the RID is delivered explicitly from the host memory controller to the NVDIMM in the E command as shown in FIG. 3A. In another embodiment, both the host memory controller and the NVDIMM can explicitly generate RID depending on the type of a read command. In yet another embodiment, neither the host memory controller nor the NVDIMM generates an RID explicitly. Instead, both the host memory controller and the NVDIMM agree on and follow an RID mechanic. After synching up during the initialization, the host memory controller and the NVDIMM can generate the same RID separately for the same package. The RID can be delivered through other pins in the feedback channel (e.g., MSG pins).

Operations after the cache miss may be asynchronous. For example, the NVDIMM asynchronously notifies the host memory controller when the data is ready using a Read_Ready signal. The Read_Ready signal is an asynchronous signal that is not necessary to align with data signals on the data bus DQ. The Read_Ready signal can be delivered through a specific pin (or pins) indicating that a data is ready to be read by the host memory controller. After the host memory controller receives the Read_Ready signal, the host memory controller issues a transaction burst command (TB) 315 and can read the data stored in the non-volatile memory on the data bus. In response to the TB command 315, the NVDIMM loads the requested data on the DQ pins stored in the non-volatile memory as well as the RID in the MSG pins. The RID 320 loaded on the MSG pins is identifies that the data 321 on the DQ pins corresponds to the data requested by the E+RD command 301b.

Conflicts for accessing the DRAM cache may occur because both the host memory controller and the NVM controller can have control over the DRAM cache. According to one embodiment, an internal operation (IOP) command can avoid the potential DRAM access conflicts that may occur when both the host memory controller and the NVM controller claim the control of the DRAM cache.

Figure 4A:
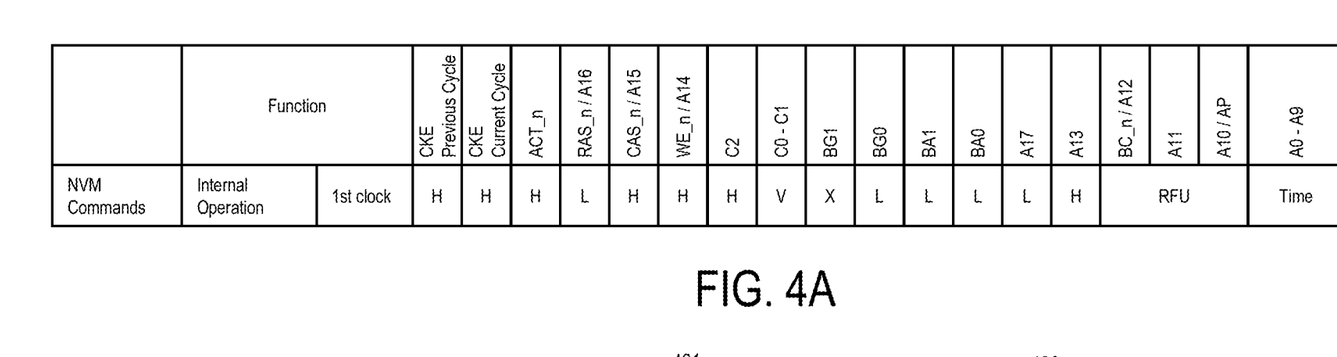
FIG. 4A is a table showing a definition of an example internal operation command, according to one embodiment.
Figure 4B:
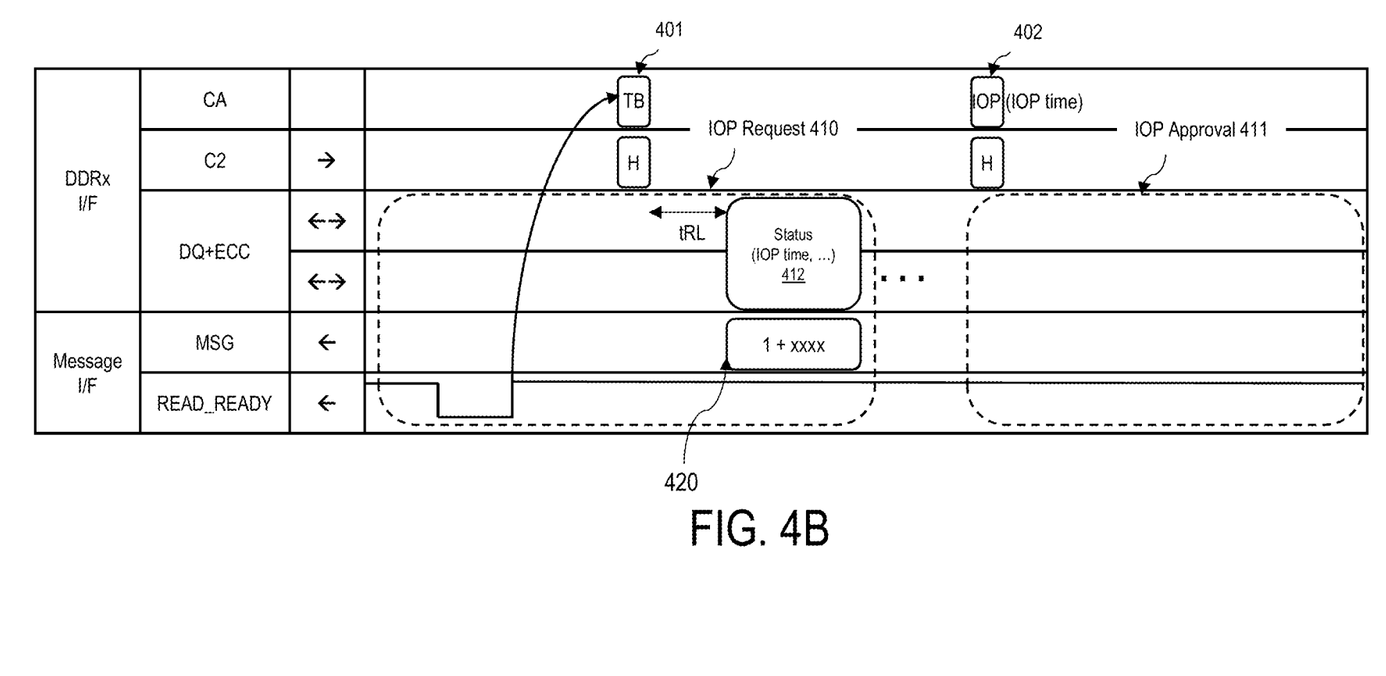
FIG. 4B shows a timing diagram of the example internal operation command, according to one embodiment.

FIG. 4A is a table showing a definition of an example internal operation command, according to one embodiment. FIG. 4B shows a timing diagram of the example internal operation command, according to one embodiment.

Occasionally, the NVDIMM needs a time to perform internal operations, such as moving data from the DRAM cache to the non-volatile memory, or from the non-volatile memory to the DRAM cache. In these cases, the NVM controller can send a request to the host memory controller asking for permission to perform the internal operations. For example, the NVM controller sends an IOP request 410 to the host memory controller asking permission and time for performing one or more internal operations.

According to one embodiment, the IOP request 410 that is sent by the NVDIMM includes a Read_Ready signal followed by a transaction burst (TB) command 401. Using the Read_Ready signal, the NVDIMM notifies the host memory controller that a message and data are ready, in this case, the IOP request 410. The MSG packet 420 that is loaded in response to the TB command 401 includes an indicator (1) that indicates that the data loaded on the DQ pins includes the status 412 of the NVDIMM instead of data. The status 412 of the NVDIMM may include at least a requested time (i.e., IOP time) to perform internal operations. In comparison, for a normal transaction burst read command, the MSG packet 320 includes an indicator (0) and an RID as shown in FIG. 3B.

The status 412 of the NVDIMM loaded on the DQ bus (and ECC) can include an IOP time that indicates how much time the NVDIMM needs for completing the internal operations. The host memory controller can read the status 412 of the NVDIMM and send an IOP command 402 to the NVM controller. The IOP command 402 may indicate an approval or disapproval for the requested IOP time. If the host memory controller approves the requested IOP time, the IOP command 402 can include an allocated time (e.g., in A0-A9 pins). According to one embodiment, the IOP time requested in the IOP request 410 may differ from the IOP time allocated in the IOP command 402. The host memory controller will not access the NVDIMM during the allocated time allowing the NVDIMM to perform the internal operations. Because an internal operation does not occupy CA and DQ buses, the shared memory channel buses are still available for another DIMM that are on the shared memory channel.

Figure 5A:
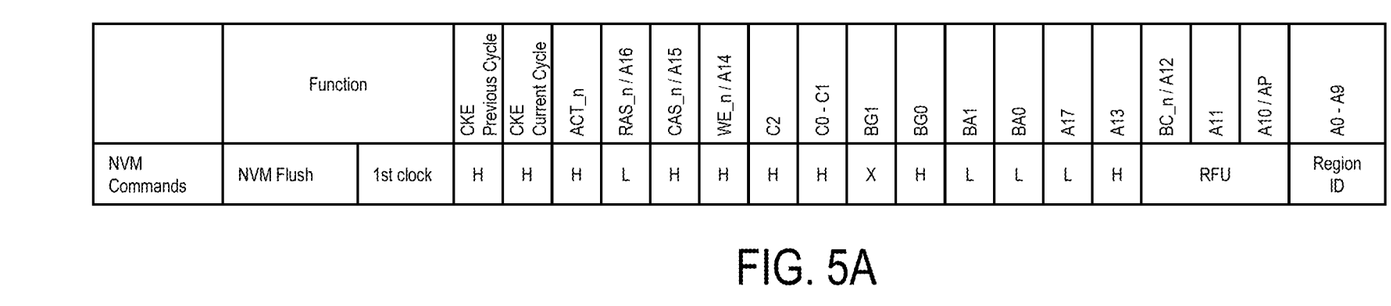
FIG. 5A is a table showing a definition of an example flush command, according to one embodiment.
Figure 5B:
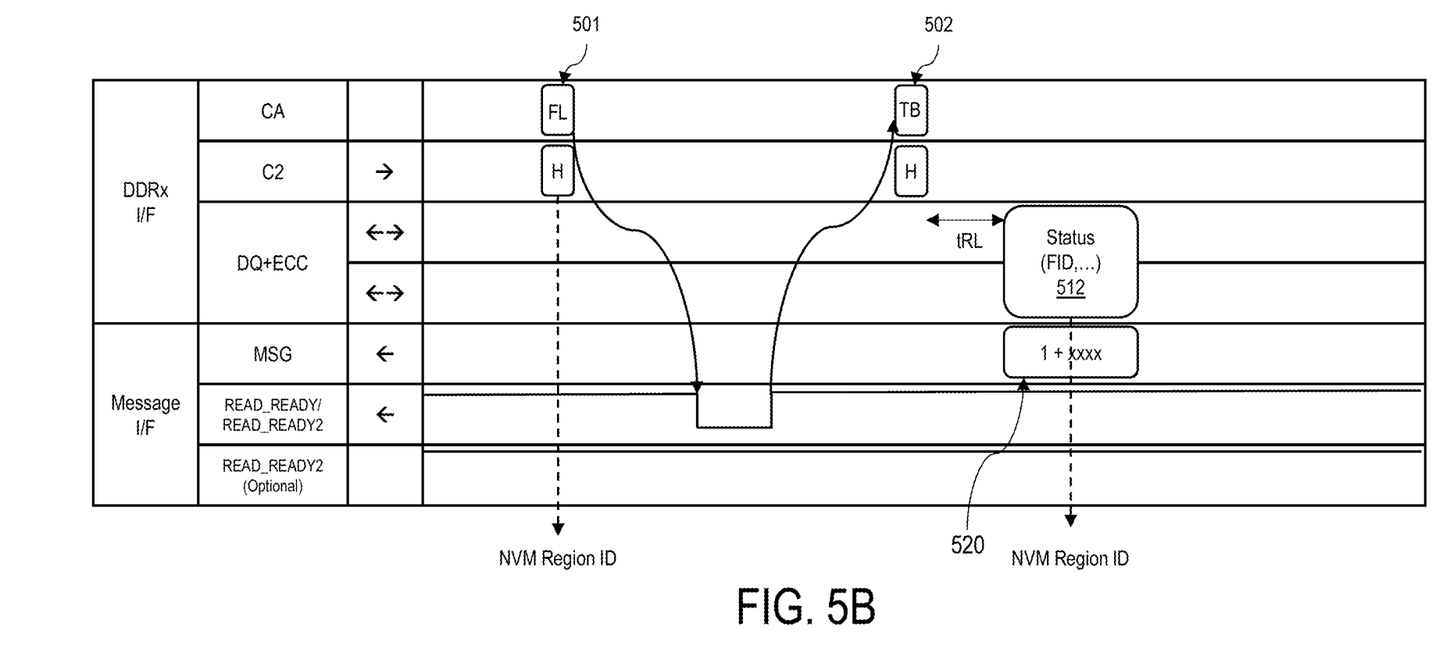
FIG. 5B shows a timing diagram of the example flush command, according to one embodiment.

According to one embodiment, a flush (FL) command is used to allow the host memory controller to instruct the NVDIMM to flush data from the write buffer and/or the DRAM cache to the non-volatile memory. FIG. 5A is a table showing a definition of an example flush command, according to one embodiment. FIG. 5B shows a timing diagram of the example flush command, according to one embodiment.

According to one embodiment, the host memory controller can send a flush command 501 including a flush ID (FID) (e.g., on the A0-A9 pins). In one embodiment, the flush ID is an address range. The host memory controller and the NVM controller can identify what address range a flush ID represents. The host memory controller instructs the NVDIMM to flush data to a particular region of the non-volatile memory based on the flush ID. In response, the NVM controller flushes dirty data from the DRAM cache to the flush ID of the non-volatile memory and sends a Read_Ready signal indicating that the flush command 501 has been completed. After receiving the Read_Ready signal, the host memory controller can send a transaction burst (TB)

command 502 to check the status of the flush command 501. The status can include the flush ID and a state (e.g., success, pending, or fail) for the flush ID. For example, when the NVDIMM has successfully completed flushing the designated region of the non-volatile memory, the NVDIMM sends the status 512 as confirmation indicating that the flush command 501 has been successfully completed. The MSG packet 520 that is loaded in response to the TB command 502 includes an indicator (1) that indicates that the data loaded on the DQ pins includes the status 512 of the NVDIMM instead of data.

Figure 6A:
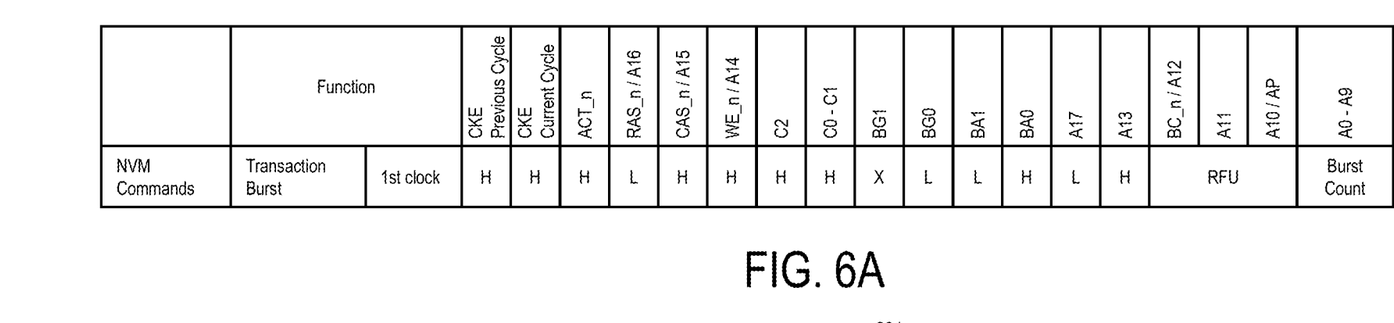
FIG. 6A is a table showing a definition of an example transaction burst (TB) command, according to one embodiment.
Figure 6B:
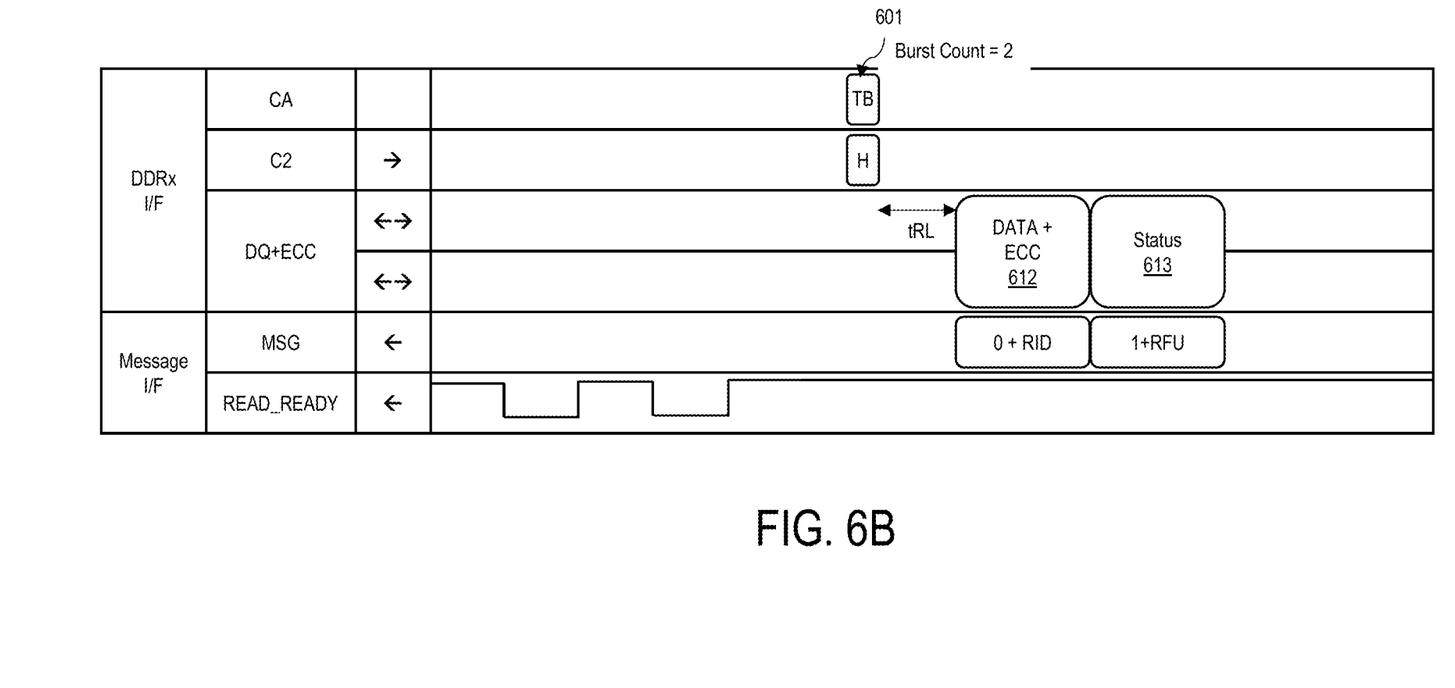
FIG. 6B shows a timing diagram of the example transaction burst (TB) command, according to one embodiment.

A transaction burst (TB) command is used to enable the host memory controller to get either data or status from the NVDIMM. According to one embodiment, the TB command can include a burst count, so the host memory controller can request one or more data and/or status from the NVDIMM using a single TB command. FIG. 6A is a table showing a definition of an example transaction burst (TB) command, according to one embodiment. FIG. 6B shows a timing diagram of the example transaction burst (TB) command, according to one embodiment.

According to one embodiment, the burst count is loaded in the A0-A9 pins of the transaction burst command. In the example shown in FIG. 6B, the TB command 601 includes a Burst count of 2 including one data read and one status read. Subsequent to the TB command 601, the NVDIMM loads the DQ pins (and ECC) with the requested data 612 and the status 613. The host memory controller distinguishes whether the data or status is loaded in the DQ pins based on the indicator (0 or 1) in the MSG pins. For example, the indicator (0) indicates that the requested data is loaded on the DQ pins, and the indicator (1) indicates that the status of the NVDIMM is loaded on the DQ pins.

Figure 7A:
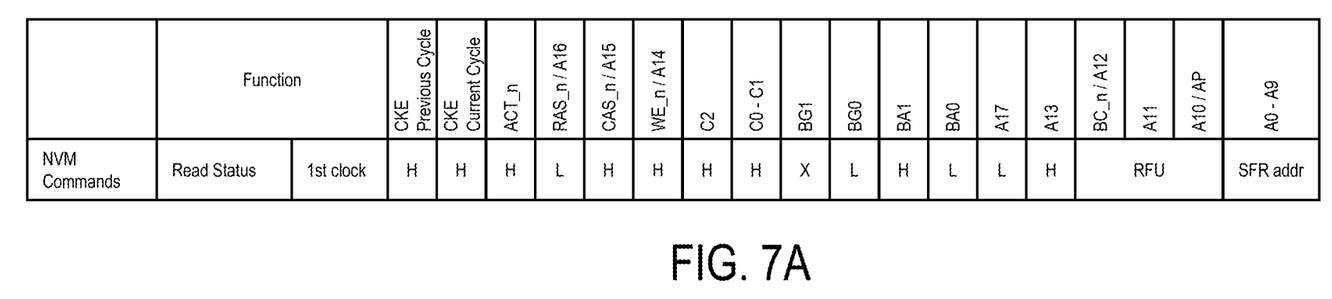
FIG. 7A is a table showing a definition of an example read status (RS) command, according to one embodiment.
Figure 7B:
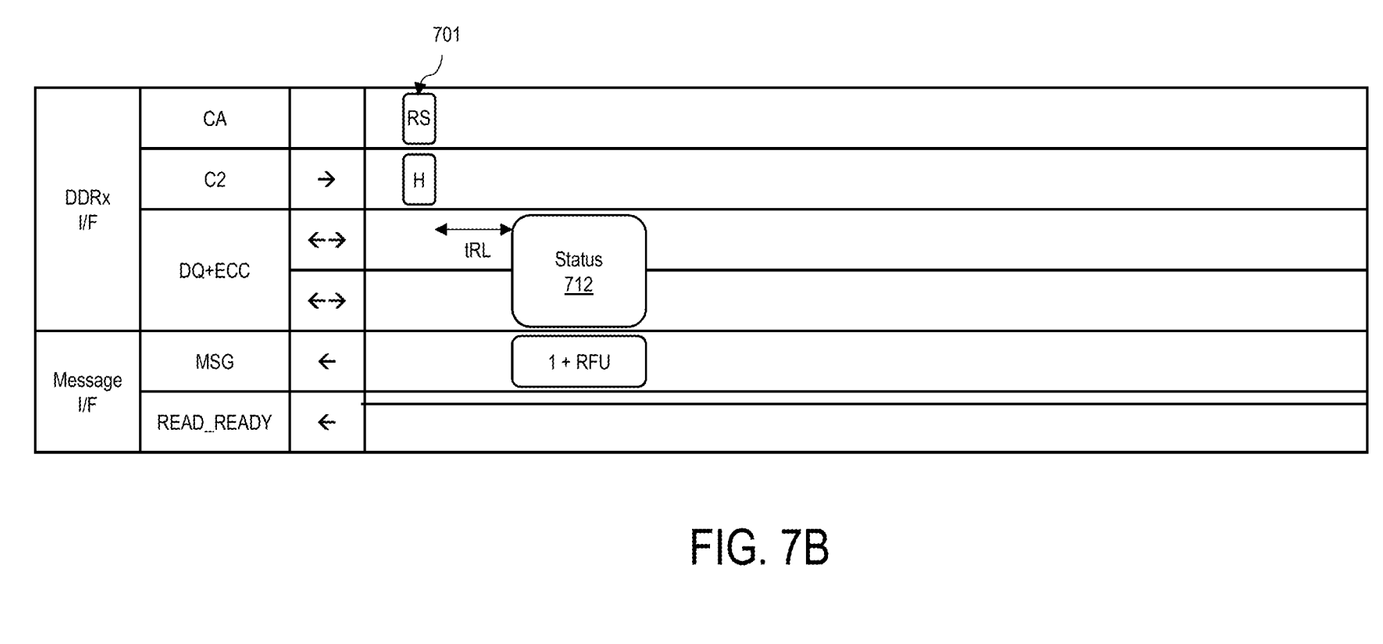
FIG. 7B shows a timing diagram of the example read status (RS) command, according to one embodiment.

According to one embodiment, a read status (RS) command is used to allow the host memory controller to proactively read a status of NVDIMM. FIG. 7A is a table showing a definition of an example read status (RS) command, according to one embodiment. FIG. 7B shows a timing diagram of the example read status (RS) command, according to one embodiment.

The host memory controller sends a read status command 701 to the NVDIMM over the CA bus. In response to the read status command 701, the NVDIMM loads its status 712 on the DQ pins (and ECC). The indicator included in the MSG indicates that the status 712 is loaded on the DQ pins. According to some embodiment, the host memory controller can send the read status command 701 to retrieve the status of the NVDIMM. The NVDIMM reports its status 712 after a predetermined time tRL, thus the host memory controller can deterministically and synchronously receive the status of the NVDIMM. For example, if the NVDIMM does not confirm that a flush command has completed, the host memory controller can proactively check the status of the NVDIMM.

In the return status packet 712, the NVDIMM can embed the number of readied data/status. In this case, even if the Read_Ready signal is lost, the host memory controller can still know how many data/status are ready. According to one embodiment, the host memory controller can read or write a specific special function register (SFR) of the NVDIMM based on an SFR address. For reading from an SFR, the host memory controller can issue a read status (RS) command. For writing to an SFR, the host memory controller can issue a normal write command to an address that corresponds to the intended SFR. The SFR may contain configurations, operations, and/or status information that are unique to the non-volatile memory of the NVDIMM.

Figure 8:
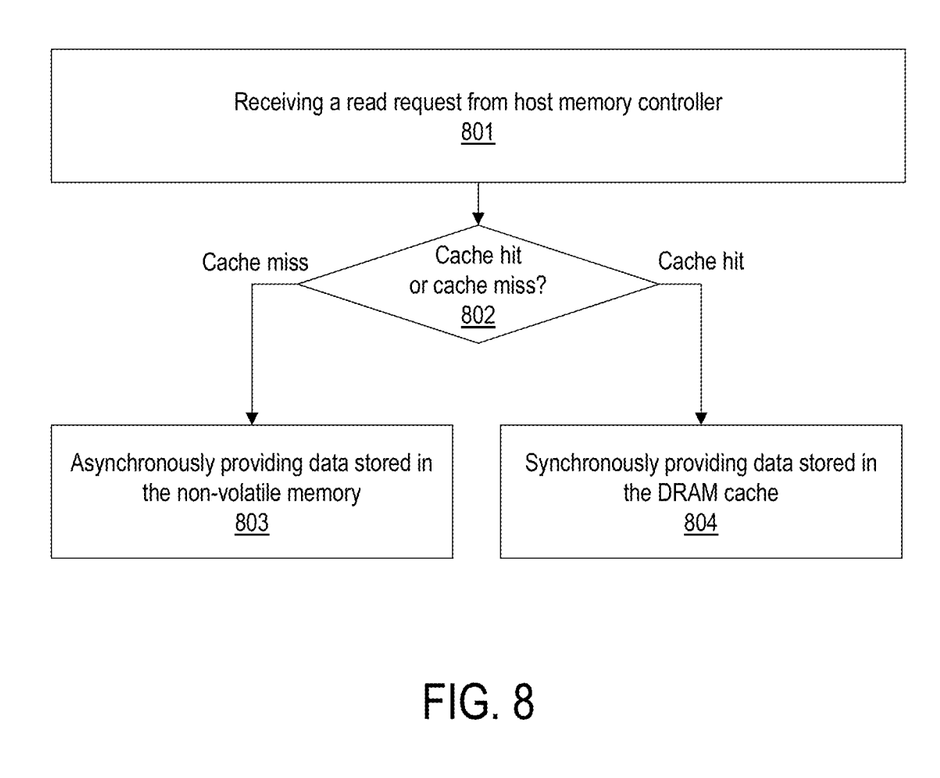
FIG. 8 is an example flowchart for providing data stored in a memory module, according to one embodiment.

FIG. 8 is an example flowchart for providing data stored in a memory module, according to one embodiment. The memory module has a non-volatile memory and a DRAM configured as a DRAM cache of the non-volatile memory. The memory module receives a read request from a host memory controller (801). A cache management logic determines if the read request is a cache hit or a cache miss depending on the stored location of the requested data (802). The cache management logic may be included in the host memory controller or the NVM controller of the memory module. In case of cache miss, the memory module asynchronously provides the data stored in the non-volatile memory of the memory module (803). In case of cache hit, the memory module synchronously provides the data stored in the DRAM cache (804). The cache management logic may be included in the host memory controller or the NVM controller of the memory module.

According to one embodiment, a method includes: providing a DDR interface between a host memory controller and a memory module, the memory module comprising a non-volatile memory and a DRAM configured as a DRAM cache of the non-volatile memory; and providing a message interface between the host memory controller and the memory module. Both the non-volatile memory and the DRAM of the memory module are coupled to a data buffer and a registering clock driver (RCD) that includes a control and address (CA) buffer. The data buffer is configured to provide data requested by the host memory controller or a status of the memory module via a data (DQ) bus of the DDR interface and the message interface. The RCD is configured to generate command sequences to the data buffer based on commands and addresses received via a CA bus of the DDR interface. Data stored in the non-volatile memory of the memory module is asynchronously accessible by a non-volatile memory controller of the memory module. Data stored in the DRAM cache is directly and synchronously accessible by the host memory controller.

The method may further include: receiving a fast cache-read request from the host memory controller to read data stored in the memory module; determining that the data requested by the fast cache-read request is stored in the DRAM cache or the non-volatile memory; synchronously providing the data on the data bus when the data is stored in the DRAM cache; and asynchronously providing the data on the data bus when the data is stored in the non-volatile memory.

The fast cache-read request may include an extended command and a DRAM read command.

The extended command may include a read ID associated with the data stored in the memory module.

The method may further include: checking a tag included in a message signal over the message interface; and determining that the fast cache-read request is a cache hit or a cache miss by comparing the tag and an extended address (EA).

The method may further include: sending a read ready signal on the message interface to instruct the host memory controller to issue a second read request to read the data from the non-volatile memory; and providing the data on the data bus in response to the second read request;

The method may further include: providing a read ready signal via the message interface to instruct a host memory controller to read a status of the memory module; receiving a read request from the host memory controller; and providing the status of the memory module on the DDR interface and a message signal including a tag. The tag included in the message signal may indicate that the data on the data bus of the DDR interface is the status of the memory module.

The status of the memory module may include an internal operating time, and the method may further include: receiving an internal operation command from the host memory controller. The internal operation command may include an approved internal operating time.

The internal operating time and the approved internal operating time may be different.

The host memory controller may not access data stored in the memory module during the approved internal operating time.

The method of may further include: receiving a flush command including a flush ID from the host memory controller; and flushing data stored in the DRAM to the non-volatile memory based on the flush ID. The status may indicate whether the flush command is successfully performed based on the flush ID.

The method may further include: providing one or more of data stored in the memory module and the status of the memory module on the DDR interface and the message interface including a tag. The tag included in a message signal over the message interface may indicate whether data loaded on the data bus of the DDR interface is the data requested by the host memory controller or the status of the memory module.

The read request may include a burst count, and the method may further include: successively providing the one or more of data stored in the memory module and the status of the memory module on the DDR interface as defined by the burst count.

The method may further include: receiving a read status command from the host memory controller; and synchronously providing the status of the memory module via the DDR interface.

According to another embodiment, a memory module includes: a non-volatile memory; a non-volatile memory controller configured to provide a data interface and a control and address (CA) interface to the non-volatile memory; a DRAM configured as a DRAM cache of the non-volatile memory; a data buffer; a registering clock driver (RCD) including a control and address (CA) buffer; and a DDR interface and a message interface to a host memory controller. Both the non-volatile memory and the DRAM are coupled to the data buffer and the registering clock driver (RCD). The data buffer is configured to provide data requested by the host memory controller or a status of the memory module via a data (DQ) bus of the DDR interface and the message interface. The RCD is configured to generate command sequences to the data buffer based on commands and addresses received via a CA bus of the DDR interface. Data stored in the non-volatile memory of the memory module is asynchronously accessible by the non-volatile memory controller. Data stored in the DRAM cache is directly and synchronously accessible by the host memory controller.

The host memory controller may send a fast cache-read request from the host memory controller to read data stored in the memory module. The memory module may synchronously provide the data on the data bus when the data is stored in the DRAM cache and asynchronously provide the data on the data bus when the data is stored in the non-volatile memory.

The memory module may send a message signal including a tag over the message interface. The host memory controller may determine that the fast cache-read request is a cache hit or a cache miss by comparing the tag and an extended address (EA).

According to yet another embodiment, a memory system includes: a host memory controller; a memory module; a DDR interface established between the host memory controller and the memory module, wherein the DDR interface comprises a data bus and a control and address (CA) bus; and a message interface established between the host memory controller and the memory module. The memory module includes: a non-volatile memory; a non-volatile memory controller configured to provide a data interface and a control and address (CA) interface to the non-volatile memory; a DRAM configured as a DRAM cache of the non-volatile memory; a data buffer; and a registering clock driver (RCD) including a control and address (CA) buffer. Both the non-volatile memory and the DRAM are coupled to the data buffer and the registering clock driver (RCD). The data buffer is configured to provide data requested by the host memory controller or a status of the memory module via a data (DQ) bus of the DDR interface and the message interface. The RCD is configured to generate command sequences to the data buffer based on commands and addresses received via a CA bus of the DDR interface. Data stored in the non-volatile memory of the memory module is asynchronously accessible by the non-volatile memory controller. Data stored in the DRAM cache is directly and synchronously accessible by the host memory controller.

The host memory controller may send a fast cache-read request from the host memory controller to read data stored in the memory module. The memory module may synchronously provide the data on the data bus when the data is stored in the DRAM cache and asynchronously provide the data on the data bus when the data is stored in the non-volatile memory.

The memory module may send a message signal including a tag over the message interface. The host memory controller may determine that the fast cache-read request is a cache hit or a cache miss by comparing the tag and an extended address (EA).

The above example embodiments have been described hereinabove to illustrate various embodiments of implementing a system and method for operating a double data rate (DDR)-compatible asynchronous memory module. Various modifications and departures from the disclosed example embodiments will occur to those having ordinary skill in the art. The subject matter that is intended to be within the scope of the invention is set forth in the following claims.

What is claimed is:

1. A method comprising:
   providing a DDR interface between a host memory controller implemented in a host computer and a memory module, the memory module comprising a non-volatile memory and a DRAM configured as a DRAM cache of the non-volatile memory; and
   providing a message interface between the host memory controller and the memory module that uses one or more communication pins of the DDR interface that are different from pins of a data (DQ) bus and a control and address (CA) bus of the DDR interface;
   wherein both the non-volatile memory and the DRAM of the memory module are coupled to a data buffer and a registering clock driver (RCD) that includes a control and address (CA) buffer, the data buffer is configured to provide data requested by the host memory controller or a status of the memory module via the data bus of the DDR interface and the message interface, and the RCD is configured to generate command sequences to the data buffer based on commands and addresses received via the CA bus of the DDR interface, wherein data stored in the non-volatile memory of the memory module is asynchronously accessible by a non-volatile memory controller of the memory module via the data bus and the CA bus of the DDR interface in conjunction with one or more signals delivered between the memory module and the host memory controller through the one or more communication pins of the message interface, and wherein data stored in the DRAM cache is directly and synchronously accessible by the host memory controller via the DDR interface.

2. The method of claim 1, further comprising:
receiving a fast cache-read request from the host memory controller to read data stored in the memory module;
determining that the data requested by the fast cache-read request is stored in the DRAM cache or the non-volatile memory;
synchronously providing the data on the data bus of the DDR interface when the data is stored in the DRAM cache; and
asynchronously providing the data on the data bus of the DDR interface when the data is stored in the non-volatile memory.

3. The method of claim 2, wherein the fast cache-read request comprises an extended command and a DRAM read command, and when it is determined that the data is stored in the non-volatile memory, not in the DRAM cache, the host memory controller issues a burst read command subsequent to the fast cache-read request to read data stored in the non-volatile memory in response to a read ready signal that is asynchronously posted on the message interface by the memory module after the data stored in the non-volatile memory is loaded on the data bus.

4. The method of claim 3, wherein the extended command includes a read ID associated with the data stored in the memory module.

5. The method of claim 2, further comprising:
checking a tag included in a message signal over the message interface; and
determining that the fast cache-read request is a cache hit or a cache miss by comparing the tag and an extended address (EA).

6. The method of claim 2, further comprising:
sending a read ready signal on the message interface to instruct the host memory controller to issue a second read request to read the data from the non-volatile memory; and
providing the data on the data bus in response to the second read request.

7. The method of claim 1, further comprising:
providing a read ready signal via the message interface to instruct the host memory controller to read a status of the memory module;
receiving a read request from the host memory controller; and
providing the status of the memory module on the DDR interface and a message signal including a tag,
wherein the tag included in the message signal indicates that the data on the data bus of the DDR interface is the status of the memory module.

8. The method of claim 7, wherein the status of the memory module includes an internal operating time, and the method further comprising:
receiving an internal operation command from the host memory controller,
wherein the internal operation command includes an approved internal operating time.

9. The method of claim 8, wherein the internal operating time and the approved internal operating time are different.

10. The method of claim 8, wherein the host memory controller does not access data stored in the memory module during the approved internal operating time.

11. The method of claim 7, further comprising:
receiving a flush command including a flush ID from the host memory controller; and
flushing data stored in the DRAM to the non-volatile memory based on the flush ID,
wherein the status indicates whether the flush command is successfully performed based on the flush ID.

12. The method of claim 7, further comprising:
providing one or more of data stored in the memory module and the status of the memory module on the DDR interface and the message interface including the tag,
wherein the tag included in a message signal over the message interface indicates whether data loaded on the data bus of the DDR interface is the data requested by the host memory controller or the status of the memory module.

13. The method of claim 12, wherein the read request includes a burst count, and the method further comprising:
successively providing the one or more of data stored in the memory module and the status of the memory module on the DDR interface as defined by the burst count.

14. The method of claim 12 further comprising:
receiving a read status command from the host memory controller; and
synchronously providing the status of the memory module via the DDR interface.

15. A memory module comprising:
a non-volatile memory;
a non-volatile memory controller configured to provide a data interface and a control and address (CA) interface to the non-volatile memory;
a DRAM configured as a DRAM cache of the non-volatile memory;
a data buffer;
a registering clock driver (RCD) including a control and address (CA) buffer; and
a DDR interface and a message interface to a host memory controller implemented in a host computer,
wherein both the non-volatile memory and the DRAM are coupled to the data buffer and the registering clock driver (RCD),
wherein the data buffer is configured to provide data requested by the host memory controller or a status of the memory module via a data (DQ) bus of the DDR interface and the message interface, and the RCD is configured to generate command sequences to the data buffer based on commands and addresses received via a control and address (CA) bus of the DDR interface,
wherein the message interface uses one or more communication pins of the DDR interface that are different from pins of the data bus and the CA bus of the DDR interface, wherein data stored in the non-volatile memory of the memory module is asynchronously accessible by the non-volatile memory controller via the data bus and the CA bus of the DDR interface in conjunction with one or more signals delivered between the memory module and the host memory controller through the one or more communication pins of the message interface, and wherein data stored in the DRAM cache is directly and synchronously accessible by the host memory controller via the DDR interface.

16. The memory module of claim 15, wherein the host memory controller sends a fast cache-read request from the host memory controller to read data stored in the memory module, wherein the memory module synchronously provides the data on the data bus of the DDR interface when the data is stored in the DRAM cache and asynchronously provides the data on the data bus of the DDR interface when the data is stored in the non-volatile memory.

17. The memory module of claim 16, wherein the memory module sends a message signal including a tag over the message interface, and wherein the host memory controller determines that the fast cache-read request is a cache hit or a cache miss by comparing the tag and an extended address (EA).

18. A memory system comprising:
a host computer comprising a host memory controller;
a memory module;
a DDR interface established between the host memory controller and the memory module, wherein the DDR interface comprises a data bus and a control and address (CA) bus; and
a message interface established between the host memory controller and the memory module that uses one or more communication pins of the DDR interface that are different from pins of a data bus and a CA bus of the DDR interface;
wherein the memory module comprises:
a non-volatile memory;
a non-volatile memory controller configured to provide a data interface and a control and address (CA) interface to the non-volatile memory;
a DRAM configured as a DRAM cache of the non-volatile memory;
a data buffer; and
a registering clock driver (RCD) including a control and address (CA) buffer, wherein both the non-volatile memory and the DRAM are coupled to the data buffer and the registering clock driver (RCD),
wherein the data buffer is configured to provide data requested by the host memory controller or a status of the memory module via a data (DQ) bus of the DDR interface and the message interface, and the RCD is configured to generate command sequences to the data buffer based on commands and addresses received via a CA bus of the DDR interface,
wherein data stored in the non-volatile memory of the memory module is asynchronously accessible by the non-volatile memory controller via the data bus and the CA bus of the DDR interface in conjunction with one or more signals delivered between the memory module and the host memory controller through the one or more communication pins of the message interface, and
wherein data stored in the DRAM cache is directly and synchronously accessible by the host memory controller via the DDR interface.

19. The memory system of claim 18, wherein the host memory controller sends a fast cache-read request from the host memory controller to read data stored in the memory module, wherein the memory module synchronously provides the data on the data bus of the DDR interface when the data is stored in the DRAM cache and asynchronously provides the data on the data bus of the DDR interface when the data is stored in the non-volatile memory.

20. The memory system of claim 19, wherein the memory module sends a message signal including a tag over the message interface, and wherein the host memory controller determines that the fast cache-read request is a cache hit or a cache miss by comparing the tag and an extended address (EA).

* * * * *